(12) United States Patent
Reohr

(10) Patent No.: US 7,336,553 B2
(45) Date of Patent: *Feb. 26, 2008

(54) ENHANCED SENSING IN A HIERARCHICAL MEMORY ARCHITECTURE

(75) Inventor: William Robert Reohr, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/697,036

(22) Filed: Apr. 5, 2007

(65) Prior Publication Data

US 2007/0183238 A1 Aug. 9, 2007

Related U.S. Application Data

(63) Continuation of application No. 11/330,539, filed on Jan. 12, 2006, now Pat. No. 7,257,042.

(51) Int. Cl.
*G11C 7/00* (2006.01)

(52) U.S. Cl. ...................................... 365/205; 365/207
(58) Field of Classification Search ................ 365/205, 365/207, 208, 189.05, 203
See application file for complete search history.

(56) References Cited

U.S. PATENT DOCUMENTS

| 4,748,596 A | * | 5/1988 | Ogura et al. ................. 365/205 |
| 5,274,598 A | | 12/1993 | Fujii et al. |
| 5,610,868 A | | 3/1997 | Inaba et al. |
| 5,808,487 A | | 9/1998 | Roy |

* cited by examiner

*Primary Examiner*—Vu A. Le
(74) *Attorney, Agent, or Firm*—Mark Wardas; Ryan, Mason & Lewis, LLP

(57) ABSTRACT

A sense amplifier circuit for sensing a logic state of a selected memory cell in a memory circuit includes a precharge circuit and a latch circuit. The precharge circuit is adapted for connection to a pair of complementary bit lines corresponding to the selected memory cell and is operative to selectively drive the pair of complementary bit lines to a first voltage in response to a first control signal. The latch circuit is adapted for connection to the pair of complementary bit lines. The sense amplifier circuit further includes a replication circuit adapted for connection to the pair of complementary bit lines. The replication circuit is operative to selectively transfer a voltage representative of a logic state on a first bit line of the pair of complementary bit lines to a second bit line of the pair of complementary bit lines in response to at least a second control signal.

20 Claims, 7 Drawing Sheets

ENHANCED SENSING IN A HIERARCHICAL MEMORY ARCHITECTURE

CROSS-REFERENCE TO RELATED APPLICATION(S)

This application is a continuation of U.S. application Ser. No. 11/330,539, filed on Jan. 12, 2006 now U.S. Pat. No. 7,257,042.

This application is related to commonly owned U.S. application Ser. No. 11/190,542, filed on Jul. 27, 2005 and entitled "Differential and Hierarchical Sensing for Memory Circuits," the disclosure of which is incorporated by reference herein.

FIELD OF THE INVENTION

The present invention relates generally to memory devices, and more particularly relates to techniques for sensing the logic state of one or more memory cells in a memory circuit.

BACKGROUND OF THE INVENTION

Memory circuits, including, for example, dynamic random access memory (DRAM), are employed in a wide variety of devices and applications. As memory access time requirements are pushed faster and noise immunity requirements are increased, the design of memory circuit architectures to meet such requirements becomes significantly more challenging. Additionally, memory size requirements are continuously increasing, thereby exacerbating speed and noise immunity problems.

Various memory architectures have been proposed to meet certain design criteria, such as, for example, memory access time, often measured as latency. However, although these known memory architectures have had some successes at reducing memory latency, they have often achieved such a reduction in memory latency at the expense of other important design criteria, such as, for example, memory density, noise immunity, power consumption, etc., which are often mutually exclusive design characteristics in a given memory architecture.

Techniques for reliably sensing the logical states of memory cells in the memory circuit architectures also become more difficult to implement as memory performance requirements (e.g., memory access time, noise immunity, memory size, etc.) are pushed. For example, as voltage supply levels are reduced, sense amplifiers in the memory circuits are significantly more sensitive to threshold variations and mismatch. In order to minimize threshold mismatch in the sense amplifiers, it is known to increase transistor dimensions. However, increasing the transistor dimensions increases the overall chip area required by the memory circuits, and is therefore undesirable.

Accordingly, there exists a need for sensing circuitry for use in a memory circuit that does not suffer from one or more of the problems exhibited by conventional sensing circuitry.

SUMMARY OF THE INVENTION

The present invention meets the above-noted need by providing, in an illustrative embodiment, improved techniques for sensing the logical states of selected memory cells in a memory architecture employing complementary bit lines.

In accordance with one aspect of the invention, a sense amplifier circuit for sensing a logic state of a selected memory cell in a memory circuit includes a precharge circuit and a latch circuit. The precharge circuit is adapted for connection to a pair of complementary bit lines corresponding to the selected memory cell and is operative to selectively drive the pair of complementary bit lines to a first voltage in response to a first control signal. The latch circuit is adapted for connection to the pair of complementary bit lines. The sense amplifier circuit further includes a replication circuit adapted for connection to the pair of complementary bit lines. The replication circuit is operative to selectively transfer a voltage representative of a logic state on a first bit line of the pair of complementary bit lines to a second bit line of the pair of complementary bit lines in response to at least a second control signal.

In accordance with another aspect of the invention, a memory circuit includes multiple word lines, multiple pairs of complementary bank bit lines, multiple block select lines, multiple of block circuits, and one or more sense amplifier circuits. Each of the block circuits includes a local bit line; a first transistor having a control terminal connected to the local bit line, a first bias terminal connected to a first bank bit line of a given pair of bank bit lines, and a second bias terminal connecting to a first voltage source; a second transistor having a control terminal connected to a corresponding one of the block select lines, a first bias terminal connected to a second bank bit line of the given pair of bank bit lines, and a second bias terminal connected to the local bit line; and a plurality of memory cells connected to the local bit line and to respective word lines in the memory circuit. The sense amplifier circuit includes a precharge circuit and a latch circuit. The precharge circuit is adapted for connection to a corresponding pair of complementary bank bit lines and is operative to selectively drive the pair of complementary bank bit lines to a first voltage in response to a first control signal. The latch circuit is adapted for connection to the corresponding pair of complementary bank bit lines. The sense amplifier circuit further includes a replication circuit adapted for connection to the pair of complementary bank bit lines. The replication circuit is operative to selectively transfer a voltage representative of a logic state on a first bank bit line of the pair of complementary bank bit lines to a second bank bit line of the pair of complementary bank bit lines in response to at least a second control signal.

In accordance with yet another aspect of the invention, an integrated circuit includes at least one sense amplifier for sensing a logic state of a selected memory cell in a memory circuit. The sense amplifier circuit in the integrated circuit includes a precharge circuit and a latch circuit. The precharge circuit is adapted for connection to a pair of complementary bit lines corresponding to the selected memory cell and is operative to selectively drive the pair of complementary bit lines to a first voltage in response to a first control signal. The latch circuit is adapted for connection to the pair of complementary bit lines. The sense amplifier circuit further includes a replication circuit adapted for connection to the pair of complementary bit lines. The replication circuit is operative to selectively transfer a voltage representative of a logic state on a first bit line of the pair of complementary bit lines to a second bit line of the pair of complementary bit lines in response to at least a second control signal.

These and other features and advantages of the present invention will become apparent from the following detailed description of illustrative embodiments thereof which is to be read in connection with the accompanying drawings.

DETAILED DESCRIPTION OF THE INVENTION

The present invention will be described herein in the context of an illustrative DRAM architecture and an illustrative sense amplifier which may be employed therewith. It should be understood, however, that the present invention is not limited to these or any particular circuit arrangements. Rather, the invention is more generally applicable to improved techniques for sensing the logical states of memory cells in a memory architecture employing complementary bit lines. Although implementations of the present invention are described herein with specific reference to n-channel metal-oxide-semiconductor (NMOS) field-effect transistor (FET) devices and p-channel metal-oxide-semiconductor (PMOS) FET devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
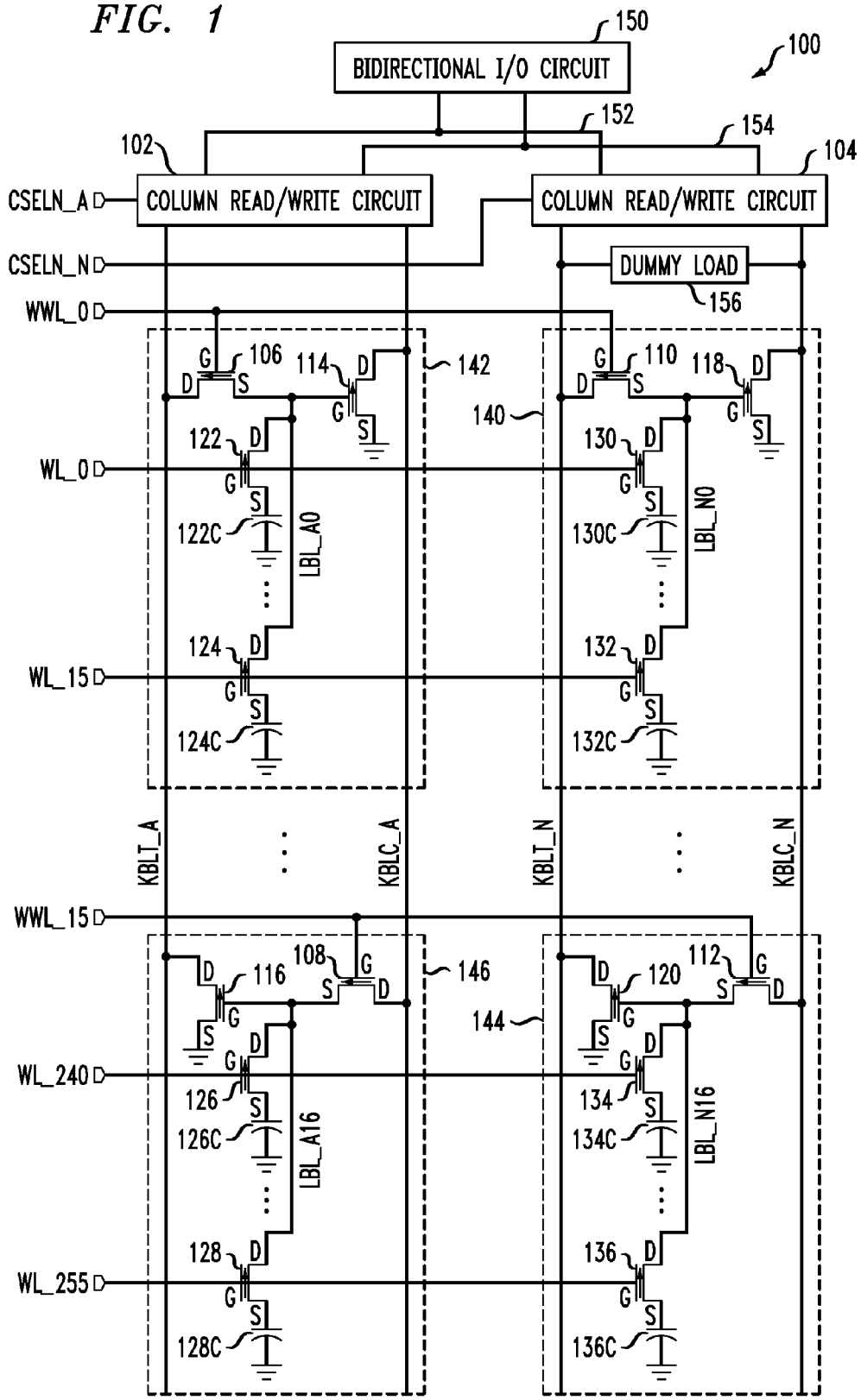
FIG. 1 is a schematic diagram depicting at least a portion of an exemplary memory circuit including symmetric bit lines, in which the sensing techniques of the present invention may be implemented.

FIG. 1 is a schematic diagram depicting at least a portion of an exemplary memory circuit 100, in which the sensing techniques of the present invention may be employed. A detailed description of memory circuit 100 is provided in U.S. application Ser. No. 11/190,542 filed on Jul. 27, 2005 and entitled "Differential and Hierarchical Sensing for Memory Circuits," the disclosure of which is incorporated by reference herein. The invention set forth in this related application and the present invention were, at the time the invention was made, owned by the same entity or subject to an obligation of assignment to the same entity, namely, International Business Machines Corporation.

As apparent from the figure, the exemplary memory circuit 100 comprises multiple pairs of symmetric bank bit lines, KBLT_A and KBLC_A, and KBLT_N and KBLC_N, where "T" denotes a true bank bit line and "C" denotes a complement bank bit line of a given pair of bank bit lines. The term "line" as used herein is intended to refer to any substance or medium (e.g., conductor, wire, trace, etc.) that is capable of conveying an electrical signal or signals. By employing pairs of symmetric bit lines, the memory circuit 100 provides a differential architecture which beneficially reduces the effects of leakage noise, thereby enhancing noise immunity in the memory circuit. While only two pairs of bank bit lines are shown, the sensing techniques of the present invention are not limited to use with any particular number of bank bit lines. Furthermore, although the bank bit lines KBLT_A, KBLC_A, KBLT_N and KBLC_N, are depicted as being oriented in a substantially vertical (e.g., column) dimension, the present invention contemplates that the bank bit lines may be oriented in an alternative direction(s), such as, for example, horizontally, diagonally, etc.

Memory circuit 100 further includes a plurality of memory cells, each of the memory cells comprising an access transistor, 122, 124, 126, 128, 130, 132, 134 and 136, and a corresponding storage capacitor, 122C, 124C, 126C, 128C, 130C, 132C, 134C and 136C, respectively, or alternative storage element. A plurality of word lines, WL_0, WL_15, WL_240 and WL_255, are connected to respective memory cells for selectively accessing the memory cells. Although the word lines are depicted as being oriented in a substantially horizontal (e.g., row) dimension, the present invention contemplates that the word lines may be oriented in an alternative direction(s), such as, for example, vertically, diagonally, etc. Moreover, the orientation of the word lines in relation to the bit lines need not be orthogonal as shown.

The memory cells in memory circuit 100 are preferably organized into a plurality of block circuits, 140, 142, 144 and 146, the block circuits being accessed by control signals supplied by corresponding block select lines, which may be referred to herein as write word lines, WWL_0 and WWL_15. Each block circuit preferably includes a local bit line exclusive to the block circuit, a first transistor, which may be a block write transistor, and a second transistor, which may be a block read transistor. The block read transistor in a given block circuit preferably includes a control terminal (e.g., a gate) connected to the local bit line, a first bias terminal (e.g., a drain) connected to a first bank bit line of a given pair of bank bit lines corresponding to the block circuit, and a second bias terminal (e.g., a source) connecting to a first voltage source supplying a first voltage, which may be ground (e.g., zero volt). The block write transistor in a given block circuit preferably includes a control terminal connected to a corresponding one of the block select lines, a first bias terminal connected to a second bank bit line of the given pair of bank bit lines, and a second bias terminal connected to the local bit line.

By way of example only, block circuit 140 preferably includes a block write transistor 110 having a gate (G) connecting to write word line WWL_0, a drain (D) connecting to true bank bit line KBLT_N, and a source (S) connected to local bit line LBL_N0, and a block read transistor 118 having a gate connected to the local bit line LBL_N0, a drain connecting to complement bank bit line KBLC_N, and a source connecting to ground. Block circuit 140 further includes a plurality of one-transistor-one-capacitor (1T1C) memory cells, including access transistors 130, 132, and corresponding storage capacitors 130C, 132C, connected to local bit line LBL_N0 and to respective word lines WL_0 and WL_15. Specifically, transistor 130 includes a gate connecting to word line WL_0, a drain connected to local bit line LBL_N0, and a source connected to a first terminal of capacitor 130C. A second terminal of capacitor 130C connects to ground, or an alternative voltage source. Likewise, transistor 132 includes a gate connecting to word line WL_15, a drain connected to local bit line LBL_N0, and a source connected to a first terminal of capacitor 132C. A second terminal of capacitor 132C connects to ground. While block circuit 140 is shown as including two memory cells, it is to be understood that a given block circuit is not limited to any particular number of memory cells.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drains, respectively, where the term "source/drain" in this context denotes a source or a drain of the MOS device.

Block circuits 142, 144, 146 are preferably configured in a manner similar to block circuit 140. Specifically, block circuit 142 comprises a first transistor 106 having a gate connecting to write word line WWL_0, a drain connecting to bank bit line KBLT_A and a source connected to local bit line LBL_A0, and a second transistor 114 having a gate connected to local bit line LBL_A0, a drain connecting to bank bit line KBLC_A, and a source connecting to ground. Block circuit 142 further includes memory cells, comprising transistors 122, 124 and corresponding storage capacitors 122C, 124C, connected to local bit line LBL_A0. Like block circuit 140, word lines WL_0 and WL15 are used to access the memory cells in block circuit 142. Block circuit 144 comprises a first transistor 112 having a gate connecting to write word line WWL_15, a drain connecting to bank bit line KBLC_N and a source connected to local bit line LBL_N16, and a second transistor 120 having a gate connected to local bit line LBL_N16, a drain connecting to bank bit line KBLT_N, and a source connecting to ground. Block circuit 144 further includes memory cells, comprising transistors 134, 136 and corresponding capacitors 134C, 136C, connected to local bit line LBL_N16. The memory cells in block circuit 144 are preferably accessed via corresponding word lines WL_240 and WL_255. Block circuit 146 comprises a first transistor 108 having a gate connecting to write word line WWL_15, a drain connecting to bank bit line KBLC_A and a source connected to local bit line LBL_A16, and a second transistor 116 having a gate connected to local bit line LBL_A16, a drain connecting to bank bit line KBLT_A, and a source connecting to ground. Block circuit 146 further includes memory cells, comprising transistors 126, 128 and corresponding storage capacitors 126C, 128C, connected to local bit line LBL_A16. Like block circuit 144, word lines WL_240 and WL_255 are used to access the memory cells in block circuit 146.

As previously described, each block circuit preferably includes a local bit line which is exclusive to the block circuit. Additionally, the block write transistor, which functions primarily as a write port for the block circuit, and block read transistor, which functions as a read port for the block circuit, helps isolate the local bit line from the corresponding pair of bank bit lines. In this manner, the load appearing on a pair of bank bit lines at any given time is significantly reduced, thereby improving latency in the memory circuit 100.

Where there is an odd number of block circuits coupled to a given pair of bank bit lines, the number of block write transistors and block read transistors connected to each bank bit line of the given pair of bank bit lines will inherently be different. Optionally, a dummy load circuit 156 can be connected to the pair of bank bit lines in order to provide more precise load matching between the two bank bit lines. Where the number of block circuits connected to a given pair of bank bit lines is substantially large (e.g., greater than about one hundred), the mismatch in load between the two bank bit lines may be so minimal that the additional semiconductor area consumed by the dummy load circuit 156 would essentially negate any benefits obtained by more closely matching the loads on the two bank bit lines.

Each pair of bank bit lines KBLT_A, KBLC_A and KBLT_N, KBLC_N, is preferably connected to a corresponding column read/write circuit 102 and 104, respectively, for selectively reading or writing a logical state of one or more memory cells in the memory circuit 100. Each of the column read/write circuits 102, 104 preferably comprises a read circuit, including one or more sense amplifiers (not individually shown) and/or related circuitry for reading the logical state of a memory cell in the corresponding pair of bank bit lines, and a write circuit, including a write current generator (not individually shown) and/or related circuitry for writing the logical state(s) of one or more memory cells in the corresponding pair of bank bit lines. In a DRAM application, the column read/write circuits 102, 104 are preferably operative to write back the data read from the memory cell, thereby restoring the memory cell to its pre-read state, since the read operation is typically destructive.

The column read/write circuits 102, 104 are preferably connected to a bidirectional input/output (I/O) circuit 150 via a pair of differential I/O lines 152 and 154. I/O lines 152, 154 preferably convey selected bank bit line signals, which are logical complements of one another. The bidirectional I/O circuit 150, which may comprise a multiplexer or an alternative switching arrangement, provides selective access to the memory circuit 100 for reading and/or writing data to the memory cells. Prior to a read or write operation, bidirectional I/O circuit 150 may be operative to precharge the differential I/O lines 152, 154 to a known voltage level, such as, for example, VDD (logic "1"), where VDD represents a positive voltage supply of the memory circuit 100. Additionally, the local bit lines in the respective block circuits are preferably precharged low. Circuitry, which may comprise, for example, one or more NMOS or PMOS transistors (not shown) connected between a corresponding local bit line and ground, may be included in the block circuits for implementing the local bit line precharge functionality.

During a write operation, the block write transistor (e.g., 110) in a given block circuit (e.g., 140) serves as a write port for the block circuit. When enabled by an appropriate control signal (e.g., logic high) on a corresponding write word line (e.g., WWL_0), the block write transistor electrically connects the local bit line (e.g., LBL_N0) to the corresponding bank bit line (e.g., KBLT_N). By way of example only, to write one or more memory cells (e.g., 130/130C, 132/132C) in block circuit 140 to a new logic state, the corresponding column read/write circuit 104 preferably drives a high or low signal, indicative of a high or low logic state, respectively, through bank bit line KBLT_N0, block write transistor 110, local bit line LBL_N0, and into one or more selected memory cells connected to the local bit line LBL_N0. A given one of the memory cells in block circuit 140 may be selected by applying an appropriate control signal (e.g., logic high) to a corresponding word line, WL_0, WL_15. Thus, to write the memory cell comprising access transistor 130 and storage capacitor 130C, a high signal (e.g., VDD) is applied to word line WL_0, thereby turning on transistor 130 and electrically connecting capacitor 130C to the local bit line LBL_N0 for storing the new logic state.

During a read operation, the block read transistor (e.g., 118) in a given block circuit (e.g., 140) serves as a read port for the block circuit. When enabled, the block read transistor pulls the bank bit line to which it is connected to ground, or an alternative voltage source. The block read transistor in a given block circuit may be enabled in one of at least three ways, namely, (i) when reading a logic "1" from one of the plurality of memory cells in the block circuit, (ii) when writing a logic "1" into one or more of the memory cells, and (iii) when writing-back (restoring) a logic "1" into one or more of the memory cells. By way of example only, when reading one of the memory cells (e.g., 130/130C) corresponding to block circuit 140, the storage capacitor 130C of the memory cell shares charge with the local bit line LBL_N0, to which access transistor 130 is connected, after the voltage on corresponding word line WL_0 rises to a logic high level (e.g., VDD). The final voltage on the local bit line LBL_N0 will depend on the charge stored in the storage capacitor 130C, the relative capacitance of the storage capacitor, and on the total capacitance of the local bit line LBL_N0, including terminals of the devices connected thereto. The charge on the storage capacitor 130C represents the logic state of the corresponding memory cell. Thus, a storage capacitor with little or no voltage across it may represent a logic "0" state. Likewise, a capacitor that is charged to a voltage above a threshold voltage of the block read transistor 118 (e.g., greater than about 0.7 volt) may represent a logic "1" state, since the stored charge is high enough to enable the block read transistor.

Assuming that the local bit line LBL_N0 is initially at ground, once the memory cell is selected, such as by turning on the access transistor 130 corresponding thereto, the memory cell holding a logic "0" will not substantially change the voltage on the local bit line. Hence, the block read transistor 118 remains turned off and conducts no significant current. In contrast, the memory cell holding a logic "1," once selected, drives the local bit line LBL_N0 above the threshold voltage of block read transistor 118. Hence, block read transistor 118 turns on and conducts current. The sense amplifier in the corresponding column read/write circuit 104 is preferably operative to detect the presence or absence of a current flowing through complementary bank bit line KBLC_N, to thereby determine whether the selected memory cell 130/130C holds a logic "1" or logic "0," respectively.

The block read transistor in each block circuit connects to either the true or complement bank bit line of the given pair of bank bit lines corresponding to the block circuit. For example, in block circuit 140, the block read transistor 118 connects to the complement bank bit line KBLC_N, while in block circuit 144, the block read transistor 120 connects to the true bank bit line KBLT_N. Additionally, block read and write transistors are preferably connected in substantially equivalent numbers to the true and complement bank bit lines. Each of the pairs of bank bit lines in exemplary memory circuit 100 may therefore be said to be symmetric. In this manner, a signal traversing either a true or complement bank bit line sees essentially the same parasitic capacitance, irrespective of the electrical path traversed. Thus, in one instance, the true bank bit line (e.g., KBLT_N) of a given pair of bank bit lines will serve as a write bus for writing a datum into a given block circuit (e.g., 140), and the corresponding complement bank bit line (e.g., KBLC_N) will serve as a read bus for retrieving a datum from that block circuit, while in another instance, the complement bank bit line will serve as a write bus for writing a datum into another block circuit (e.g., 144), and the true bank bit line will serve as a read bus for retrieving a datum from that other block circuit.

The block read transistor in each block circuit essentially serves as at least part of a transconductance amplifier, transforming a voltage on a corresponding local bit line into a read current. That read current can discharge the precharged bank bit line connected to the block read transistor only if the block read transistor is enabled by reading a logic high ("1") from a memory cell connected to its local bit line. If, however, the selected cell stores a logic low ("0"), the read transistor ideally will be shut off—so that the read current will be substantially zero—and the bank bit line to which the block read transistor is connected will remain precharged to a high voltage.

Figure 2:
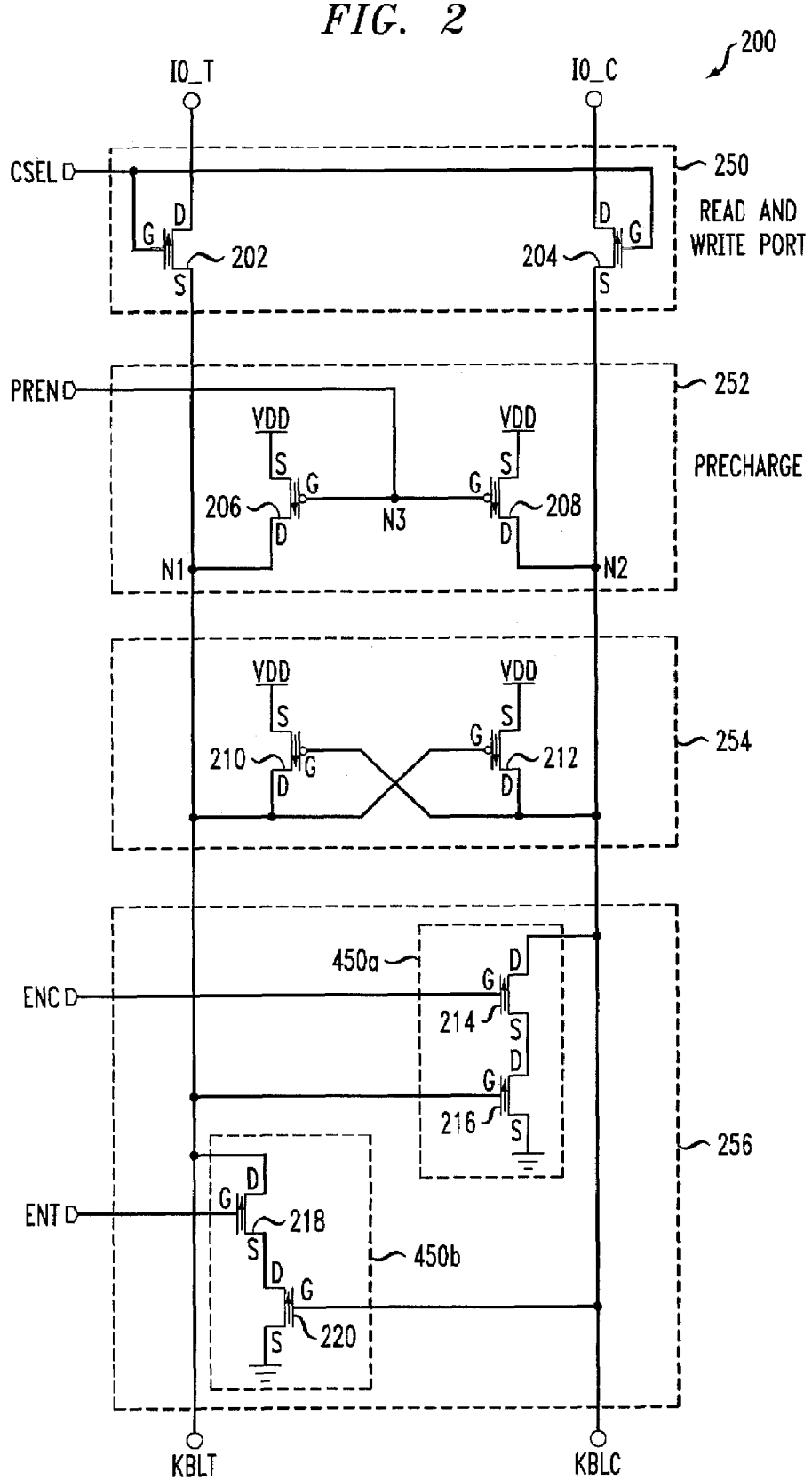
FIG. 2 is a schematic diagram illustrating at least a portion of an exemplary sense amplifier suitable for use in the memory circuit of FIG. 1, in accordance with one embodiment of the present invention.

As previously explained, sense amplifiers included in the column read/write circuits 102, 104, are preferably employed to detect the logic states of selected memory cells in the memory circuit 100. FIG. 2 is a schematic diagram illustrating an exemplary sense amplifier circuit 200, formed in accordance with one embodiment of the present invention, which is suitable for use in the exemplary memory circuit 100 of FIG. 1. It is to be understood that the present invention is not limited to the particular sense amplifier circuit shown. Sense amplifier circuit 200 preferably includes a read and write port 250, a precharge circuit 252, a latch circuit 254, and a replication circuit 256. Sense amplifier 200 connects to a corresponding pair of bank bit lines, KBLT and KBLC, at nodes N1 and N2, respectively, where KBLT may be a true bank bit line and KBLC may be a complement bank bit line. The sense amplifier circuit 200, when used in combination with the memory circuit 100 of FIG. 1, forms a hierarchical bit line sensing scheme for detecting the logic state(s) of one or more memory cells in the memory circuit.

The read and write port 250 in sense amplifier circuit 200 selectively connects the corresponding pair of bank bit lines, KBLT and KBLC, to a bidirectional I/O circuit (e.g., bidirectional I/O circuit 150 shown in FIG. 1), or an alternative circuit external to the sense amplifier, in response to at least one control signal, CSEL, presented to the read and write port. The read and write port 250 preferably includes a first NMOS transistor device 202 and a second NMOS transistor device 204. A drain of transistor device 202 is adapted for connection to a first I/O line, IO_T, which may be a true I/O line, a source of device 202 is connected to the precharge circuit 252 at node N1, and a gate of device 202 is adapted for receiving the control signal CSEL. A drain of transistor device 204 is adapted for connection to a second I/O line, IO_C, which may be a complement I/O line, a source of device 204 is connected to the precharge circuit 252 at node N2, and a gate of device 204 is adapted for receiving the control signal CSEL. The I/O lines, collectively, form a differential input/output of the sense amplifier circuit 200, since access to the sense amplifier circuit via the I/O lines IO_T and IO_C is preferably bidirectional. Alternatively implementations of the read and write port 250 are similarly contemplated by the present invention. For example, one or both of NMOS transistor devices 202, 204 may be replaced by PMOS transistor devices, with a gate of the PMOS device receiving a logical complement of the control signal CSEL, as will be understood by those skilled in the art.

When the control signal CSEL is a logic low level, transistor devices 202 and 204 are turned off, thereby disconnecting bank bit lines KBLC and KBLT from I/O lines IO_C and IO_T, respectively, and allowing nodes N1 and N2 to float. Precharge circuit 252 functions primarily to set nodes N1 and N2 (i.e., true and complement bank bit lines KBLT, KBLC) to a known voltage level (e.g., VDD) prior to a read or write operation. During a read operation, the block read transistor (e.g., 118) in a selected block circuit (e.g., 140) in the memory circuit 100 of FIG. 1 essentially serves as a first stage sense amplifier, discharging a precharged bank bit line (e.g., KBLC_N) when a logic high level is read out of memory cell 130/130C or 132/132C.

Precharge circuit 252 preferably comprises a first PMOS transistor device 206 having a source connecting to VDD, or an alternative voltage source, a drain connected to true bank bit line KBLT at node N1, and a gate adapted for receiving a control signal, PREN, at node N3. Precharge circuit 252 further comprises a second PMOS transistor device 208 having a source connecting to VDD, a drain connected to complement bank bit line KBLC at node N2, and a gate connected to the gate of transistor device 206 at node N3. The control signal PREN is used to selectively activate the precharge circuit 252, such that when PREN is, for instance, a logic low level (e.g., ground), transistor devices 206 and 208 are turned on, thereby pulling up nodes N1 and N2 substantially to VDD. The benefits of precharging the bank bit lines high prior to performing a read, write or restore (write-back) operation will be described in further detail herein below in conjunction with illustrative examples. When read and write port 250 is enabled for bidirectional operation, such as by applying a logic high CSEL signal, the precharge circuit 252 is preferably disabled so as not to interfere with the transfer of the logic state to and from bit line memory circuits, which may comprise the sense amplifier circuit 200 and block circuits 140, 144, during their active operation (e.g., read, write, or restore operation).

The latch circuit 254, which preferably includes a pair of cross-coupled PMOS transistor devices 210 and 212, functions primarily: 1) to partially latch/hold the final logic state on the true and complement bank bit lines KBLT and KBLC, respectively; 2) to hold either the true or the complement bit line high during a write operation; and 3) to suppress noise. Specifically, a source of transistor device 210 connects to VDD, or an alternative voltage supply, a drain of device 210 is connected to the true bank bit line KBLT at node N1, a gate of transistor device 210 is connected to the complement bank bit line KBLC at node N2, a source of device 212 connects to VDD, a drain of device 212 is connected to the complement bank bit line KBLC at node N2, and a gate of device 212 is connected to the true bank bit line at node N1. Latch circuit 254, however, is not limited to the particular circuit arrangement shown.

The replication circuit 256 in sense amplifier circuit 200 preferably functions to selectively transfer an inverse of the logic state on the complement bank bit line KBLC to the true bank bit line KBLT or vice versa. Replication circuit 256 preferably includes a first switch circuit, 450a, comprising first and second NMOS transistor devices, 214 and 216, respectively, connected in a stacked arrangement, and a second switch circuit, 450b, comprising third and fourth NMOS transistor devices, 218 and 220, respectively, also connected in a stacked arrangement. Each of the switch circuits 450a, 450b, which may be referred to collectively as 450, is connected between the pair of bank bit lines KBLT, KBLC. Specifically, in first switch circuit 450a, a drain of transistor device 214, which may be considered an enable device, preferably connects to the complement bank bit line KBLC, a source of device 214 is connected to a drain of transistor device 216, a gate of device 214 is adapted for receiving a first control signal, ENC, a source of device 216 connects to ground, or an alternative voltage source, and a gate of device 216 connects to the true bank bit line KBLT. Likewise, in second switch circuit 450b, a drain of transistor device 218, which maybe considered an enable device, preferably connects to the true bank bit line KBLT, a source of device 218 is connected to a drain of transistor device 220, a gate of device 218 is adapted for receiving a second control signal, ENT, a source of device 220 connects to ground, or an alternative voltage source, and a gate of device 220 connects to the complement bank bit line KBLC. Control signals ENC and ENT may be considered strobe signals.

First and second switch circuits 450a, 450b are selectively activated by the control signals ENC and ENT, respectively, via corresponding enable transistors 214 and 218. When signal ENC is high, device 214 is turned on, thereby enabling the first switch circuit 450a. Device 216 in first switch circuit 450a and device 212 in the latch circuit 254, together, form an inverter having an input connected to the true bank bit line KBLT and an output connected to the complement bank bit line KBLC. Thus, the complement bank bit line KBLC will be set to the logical inverse of the true bank bit line KBLT when strobe signal ENC is active (e.g., high). Similarly, when signal ENT is high, device 218 is turned on, thereby enabling the second switch circuit 450b. Device 220 in second switch circuit 450b and device 210 in the latch circuit 254, together, form an inverter having an input connected to the complement bank bit line KBLC and an output connected to the true bank bit line KBLT. Thus, the true bank bit line KBLT will be set to the logical inverse of the complement bank bit line KBLC when strobe signal ENT is active (e.g., high).

It is to be appreciated that although the exemplary sense amplifier circuit 200 is illustrated as comprising a plurality of separate functional blocks, one or more of these blocks can be combined with one another, or with other circuit blocks external to the sense amplifier. For instance, the latch circuit functionality may be integrated with the replication circuit 256. This can be accomplished, for example, by replacing transistors 212, 214 and 216 with a tristatable inverter having a control input adapted to receive strobe signal ENC, an input adapted for connection to true bank bit line KBLT, and an output adapted for connection to complement bank bit line KBLC. Similarly, transistors 210, 218 and 220 can be replaced by a tristatable inverter having a control input adapted to receive strobe signal ENT, an input adapted for connection to complement bank bit line KBLC, and an output adapted for connection to true bank bit line KBLT.

During either a read or a write operation, one of the strobe signals ENT, ENC is enabled to copy/transfer a datum from an active bank bit line to an opposite and inactive bank bit line. The active bank bit line is defined herein as the bank bit line in a given pair of bank bit lines which is connected to a corresponding active block read transistor. As apparent from FIG. 1, for a given pair of bank bit lines, for example KBLT_N and KBLC_N, the active bank bit line when accessing block circuit 140 will be KBLC_N, since the block read transistor 118 is connected to KBLC_N. When accessing block circuit 144, the active bank bit line will be KBLT_N, since the block read transistor 120 is connected to KBLT_N. Thus, the active bank bit line may change depending on which block circuit is active for accessing a selected memory cell.

The particular strobe signal ENT, ENC is enabled only after a valid logic state (the logic state read out of a selected memory cell) has had time to develop on the active bank bit line. For example, strobe signal ENT would preferably be activated just after a weak 0 (corresponding to a weak 1 read from the selected memory cell) could be established on the complement bank bit line KBLC. If strobe signal ENT is activated too early with respect to the signal development within the memory circuit (see FIG. 1), the true bank bit line KBLT may be inadvertently discharged by the replication circuit 256. Similarly, if the strobe signal ENT is activated too late relative to the signal development, the complement bank bit line KNLC could become discharged primarily as a result of leakage through unselected block read transistors, thereby yielding an erroneous result. Preferably, strobe signal ENT is activated just after at least a weak logic "0" signal can be established on complement bank bit line KBLC. The phrase "weak logic '0'" as used herein is intended to be defined as the voltage level at which the portion of the replication circuit 256 corresponding to the active bank bit line (e.g., device 220) is turned off, or at least is only weakly turned on (e.g., about a transistor threshold voltage or less). The same holds true for the strobe signal ENC when the block read transistor (e.g., 120) is connected to the true bank bit line rather than the complement bank bit line, as in block circuit 144 shown in FIG. 1.

Figure 3A:
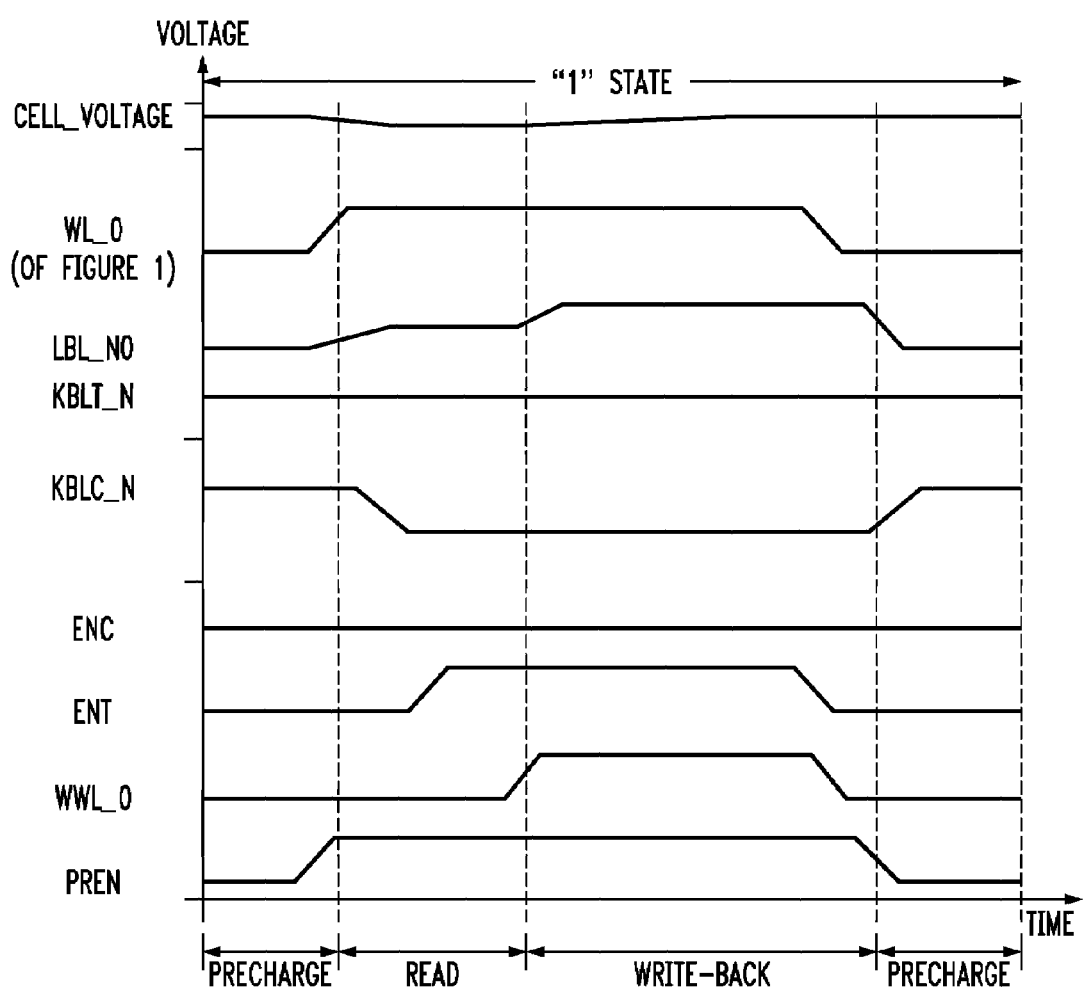
FIGS. 3A through 3D are graphical illustrations depicting exemplary logic waveforms corresponding to the sense amplifier shown in FIG. 2, in accordance with the invention.
Figure 3B:
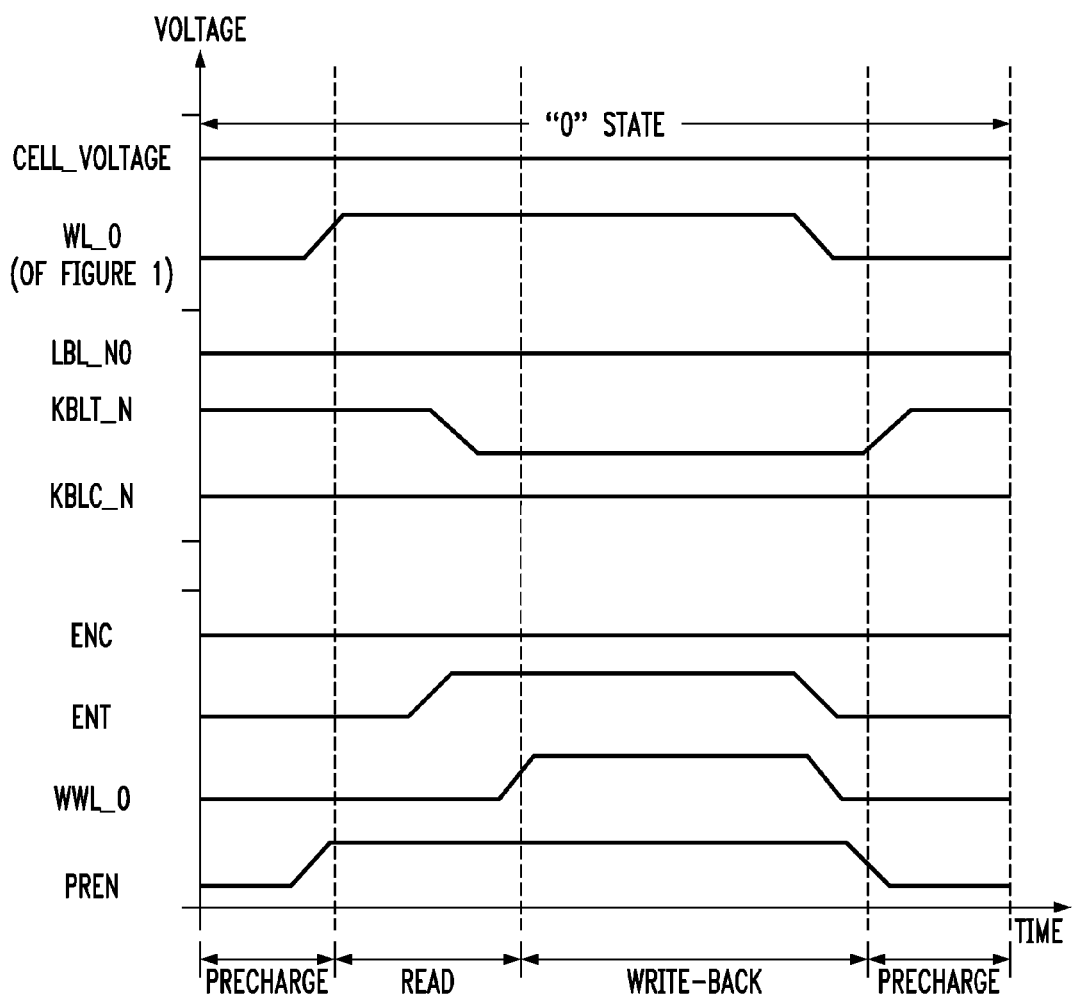
Figure 3C:
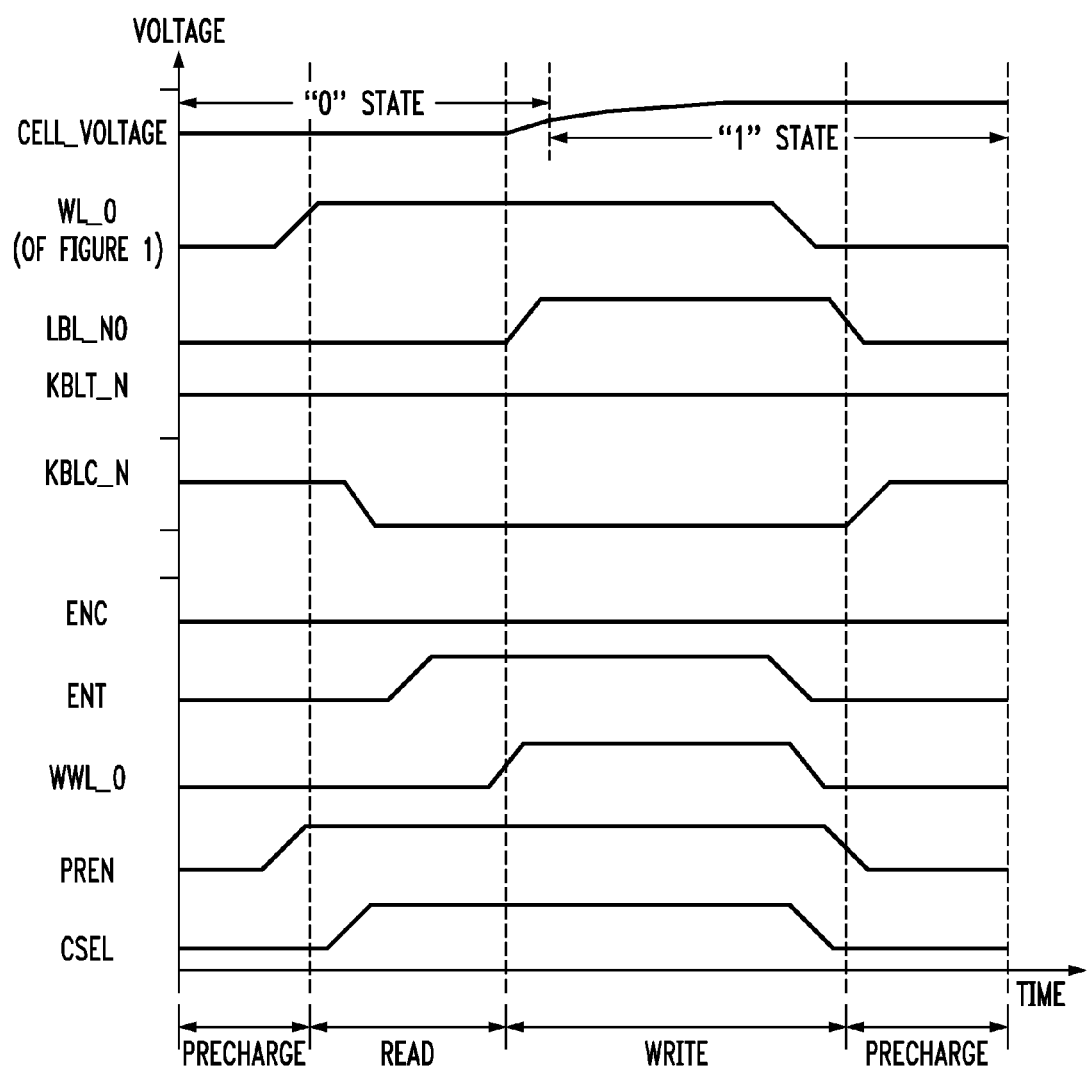
Figure 3D:
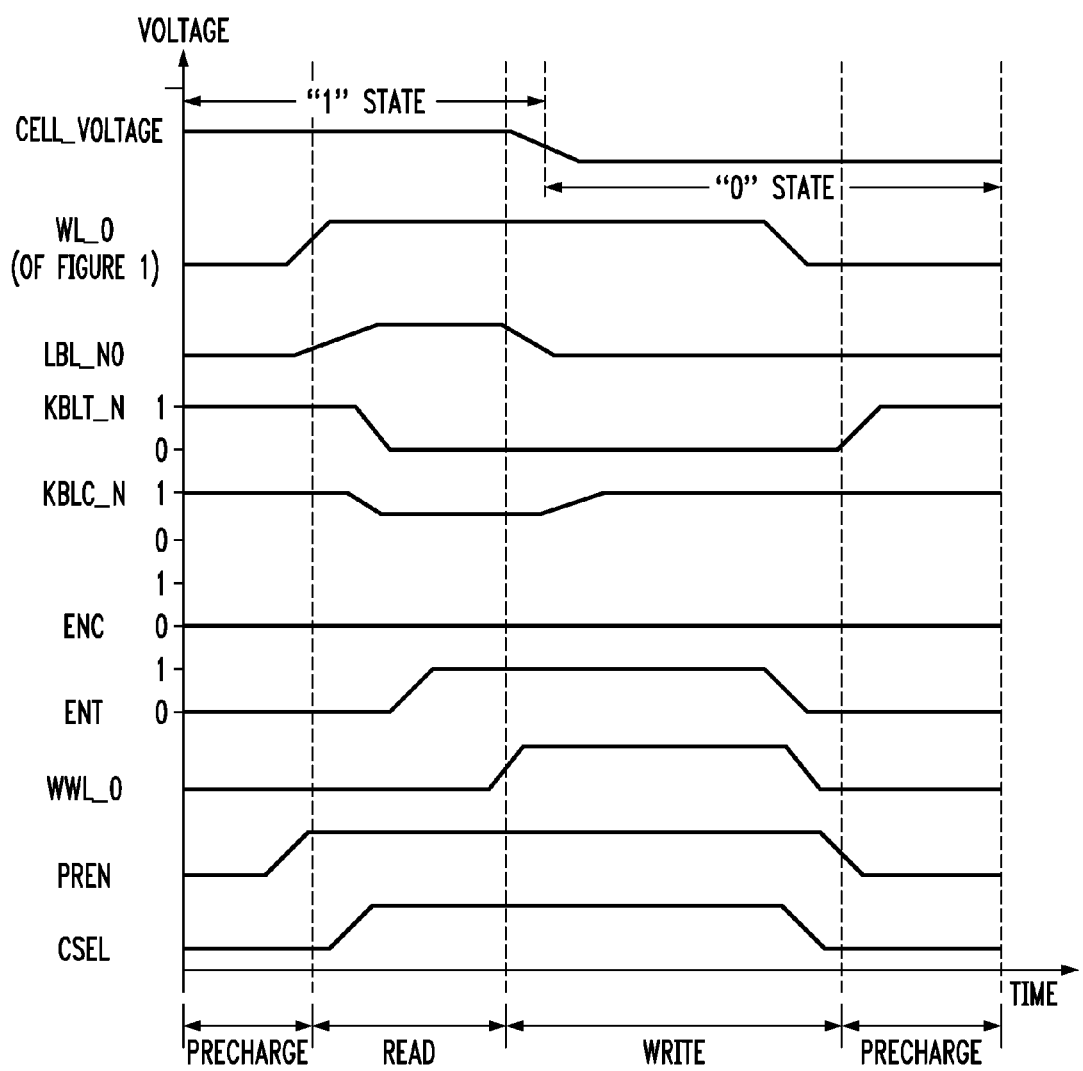

By way of example only, and without loss of generality, operation of the illustrative sense amplifier circuit 200 will now be described with reference to the exemplary logic waveforms depicted in FIGS. 3A-3D. FIG. 3A depicts an exemplary "Read 1" operation from selected memory cell 130/130C. FIG. 3B depicts an exemplary "Read 0" operation from memory cell 130/130C. FIG. 3C depicts an exemplary "Write 1" operation into memory cell 130/130C in which the state of the memory cell is changed from a 0 to a 1. FIG. 3D depicts an exemplary "Write 0" operation into memory cell 130/130C in which the state of the memory cell is changed from a 1 to a 0. In FIGS. 3A-3D, the waveform "Cell_Voltage" represents the voltage across the storage capacitor 130C of the selected memory cell.

Prior to a read or write access, control signal PREN is preferably driven to a logic low level (e.g., zero volt), thereby turning on transistors 206 and 208 and precharging both true and complement bank bit lines KBLT and KBLC, respectively, to VDD. Once the bank bit lines have been precharged high, signal PREN is brought to a logic high level. This is shown in a "Precharge" phase in FIGS. 3A-3D. Control signal PREN is held high, thereby disabling the precharge circuit 252, during the read or write access.

During a read access of a selected memory cell in the memory circuit 100 (see FIG. 1), for example, memory cell 130/130C, word line WL_0 is driven to a logic high level, thereby turning on access transistor 130 in the selected memory cell. Depending on the logic state stored in the selected memory cell, one of the bank bit lines, for example KBLC_N, is either pulled low through corresponding block read transistor 118, or is kept precharged to VDD. Meanwhile, the other bank bit line, for example KBLT_N, remains precharged to VDD regardless of the state of the selected memory cell. During the read phase, corresponding write word line WWL_0 remains at a low logic level, thereby keeping block write transistor 110 turned off and isolating true bank bit line KBLT_N0 from the local bit line LBL_N0. This write word line behavior is made consistent for all accesses to the memory cell, whether in the first part of a read access (its "Read" phase) depicted in FIGS. 3A and 3B, or in the first part of a write access (also its "Read" phase) depicted in FIGS. 3C and 3D.

When a logic high is stored in the selected memory cell 130/130C, local bit line LBL_N0 will be driven high once access transistor 130 is turned on. Local bit line LBL_N0 being high will turn on block read transistor 118, thereby pulling complement bank bit line KBLC_N to a logic low level (e.g., ground). The true bank bit line KBLT_N will remain precharged substantially to VDD. This is shown in the first part of the Read phase in FIG. 3A. In contrast, when a logic low is stored in the selected memory cell 130/130C, as depicted in FIG. 3B, local bit line LBL_N0 will remain low when access transistor 130 is turned on. Local bit line LBL_N0 being low will keep block read transistor 118 turned off, and thus complement bank bit line KBLC_N will remain precharged high along with true bank bit line KBLT_N.

After a certain delay period, during which the logic state of the selected memory cell has had adequate time to establish itself on one of the bank bit lines (e.g., KBLC) regardless of the type of access (read, write, or restore), the appropriate strobe signal (e.g., ENT) is activated so as to replicate (i.e., copy) a logic state representative of the logic state read from the selected memory cell onto the other bank bit line (e.g., KBLT). This is illustrated in a latter part of the Read phase in FIGS. 3A and 3B. In the exemplary embodiment described herein, a logical inversion of the state read from the selected memory cell 130/130C is first produced on the complement bank bit line KBLC_N, and then further inverted and copied onto the true bank bit line KBLT_N, as previously explained. It is to be appreciated, however, that while the logical inversion performed during the replicate process provides a simple implementation of the replication circuit 256 (see FIG. 2), such an inversion is not a requirement of the invention.

When reading a logic high (Read 1) from the selected memory cell in FIG. 3A, once at least a weak logic low has been established on complement bank bit line KBLC_N, strobe signal ENT is driven to a logic high level, thereby enabling switch circuit 450b. In this case (i.e., reading a 1 from memory cell 130/130C) the true bank bit line KBLT_N remains precharged to a logic high level since transistor 220 does not conduct current due the presence of a weak logic low at its gate terminal. Again, a weak logic low is defined herein to be a potential which is just below the threshold voltage of a transistor. Strobe signal ENC is kept at a logic low level. It should be understood that the high logic state stored in memory cell 130/130C is replicated onto true bank bit line KBLT_N in preparation for the subsequent Write-Back phase, which will restore selected memory cell 130/130C to a strong logic high level ("1"). This is illustrated in the latter part of the Read phase in FIG. 3A. The phrase "strong logic high level" may be defined as a voltage level which is substantially close to the positive voltage supply, VDD.

When reading a logic low (Read 0) from the selected memory cell in FIG. 3B, complement bank bit line KBLC_N remains precharged to a logic high level because block read transistor 118 remains off. Given enough time to establish at least a weak logic low on complement bank bit line KBLC_N, even though in this case a logic high level actually remains on the bank bit line, the strobe signal ENT is driven high while strobe signal ENC remains low, thereby enabling switch circuit 450a. This time, switch circuit 450a conducts since both gate inputs to transistors 218, 220 are driven high (active), thereby discharging true bank bit line KBLT_N. It should be understood that the low logic state stored in memory cell 130/130C is replicated onto true bank bit line KBLT_N in preparation for the subsequent Write-Back phase, which will restore to memory cell 130/130C to a strong logic high level ("1"). This is shown in the latter part of the Read phase in FIG. 3B.

During a write phase of the selected memory cell 130/130C, as may be performed, for example, during a write-back (restore) operation in a DRAM application or during a data write to the selected memory cell, write word line WWL_0 corresponding to the selected memory cell is driven to a logic high level, thereby turning on block write transistor 110. When the block write transistor 110 corresponding to the selected memory cell 130/130C is turned on, the local bit line LBL_N0 will be driven to the voltage potential of the true bank bit line KBLT_N. For the illustrative case in which a logic high is to be written back into the selected memory cell 130/130C, such as after reading a logic high from the memory cell as depicted in FIG. 3A, local bit line LBL_N0 will be pulled high. With the word line WL_0 corresponding to the selected memory cell remaining active (e.g., logic high) during the write phase, the memory cell voltage, as measured across the storage capacitor 130C, will begin to charge to the voltage potential of the local bit line LBL_N0 through access transistor 130. After a time sufficient to restore the logic state of the selected memory cell, the word line WL_0 will be driven to a logic low level, thereby unselecting the memory cell by isolating the corresponding storage capacitor 130C from the local bit line LBL_N0. Write word line WWL_0 is then driven to a logic low level, as is strobe signal ENT, thereby completing the write-back operation. This is shown in a "Write-Back" phase in FIG. 3A.

Similarly, for the illustrative case in which a logic low is to be written back into the selected memory cell 130/130C, such as after reading a logic low from the memory cell, as depicted in FIG. 3B, local bit line LBL_N0 will be pulled substantially to ground (a strong logic low level) regardless of whether it had been a weak or a strong logic low level. To enable this restore of a strong logic low level, write word line WWL_0 is driven to a high logic level, which enables block write transistor 110 to pull the local bit line LBL_N0 to ground. With word line WL_0 corresponding to the selected memory cell remaining high during the write-back phase, the memory cell voltage measured across the storage capacitor 130C will be driven to ground, the voltage potential of the local bit line LBL_N0, through access transistor 130. After a time sufficient to restore the logic state of the selected memory cell, the word line WL_0 will be driven to a logic low level, thereby unselecting the memory cell by isolating the corresponding storage capacitor 130C from the local bit line LBL_N0. Write word line WWL_0 is then driven to a logic low level, as is strobe signal ENT, thereby completing the write-back operation. This is shown in a "Write-Back" phase in FIG. 3B.

In a typical DRAM application, a refresh operation is required to be performed periodically so that the respective logic states stored in the DRAM memory cells are not lost. Performing a refresh operation generally involves performing a read access to a selected memory cell, which includes a Read Phase followed by a Write-Back phase, as illustrated in FIGS. 3A and 3B. During the refresh operation however, unlike a read access, data is not driven to the outputs of the memory circuit.

A data write operation of the selected memory cell 130/130C will now be described, with reference to FIGS. 3C and 3D. During the "Precharge" phase, both the true and complement bank bit lines, KBLT_N and KBLC_N, respectively, will be driven initially to a logic high level, as previously explained. FIG. 3C illustrates an exemplary methodology for writing a logic high level (Write 1) into selected memory cell 130/130C when its initial state is a logic low level. As apparent from FIG. 3C, during the Read phase, the write word line WWL_0 corresponding to the selected memory cell 130/130C is held at a logic low level, thereby isolating local bit line LBL_N0 from true bank bit line KBLT_N. Word line WL_0 is driven to a logic high level, thereby turning on access transistor 130 and allowing the local bit line LBL_N0 to be driven to the logic level stored in the corresponding capacitor 130C of the selected memory cell, in this case a logic low level. Control signal CSEL is driven to a logic high level, thereby turning on transistors 202 and 204 in read and write port 250 and connecting the bank bit lines KBLT_N and KBLC_N to a corresponding pair of IO lines IO_T and IO_C, respectively.

In order to write a logic high into the selected memory cell, as depicted in FIG. 3C, true bank bit line KBLT_N is driven to a logic high level via true I0 line IO_T and complement bank bit line KBLC_N is driven to a logic low level via complement 10 line IO_C. During a "Write" phase, write word line WWL_0 is driven high to thereby turn on block write transistor 110 corresponding to the selected memory cell. Turning on transistor 110 causes the local bit line LBL_N0 to be driven to the logic level of the corresponding true bank bit line, which is high in this illustrative case. Since word line WL_0 remains active during the Write phase, the capacitor 130C corresponding to the selected memory cell begins to charge up substantially to the voltage potential (logic high) of the local bit line LBL_N0 through access transistor 130. Once a sufficient amount of time has passed to allow the cell voltage (Cell_Voltage), as measured across storage capacitor 130C, to substantially reach the potential of the intended logic state, in this case a logic high level, word line WL_0 is driven low, thereby turning off access transistor 130 and isolating the storage capacitor 130C from the bank bit lines. Write word line WWL_0 and control signal CSEL are then driven low, thus completing the Write phase.

In the illustrative case of FIG. 3C in which a logic low is initially stored in the selected memory cell, the block read transistor 118 corresponding to the selected memory cell will be turned off, and therefore no contention problem exists between block read transistor and the transistor in latch circuit 254. This is not the case when trying to write a logic low into a selected memory cell which initially has a logic high level stored therein, as will be described below with reference to FIG. 3D.

FIG. 3D illustrates the exemplary case in which a logic low is to be written into a selected memory cell 130/130C. In this case, the selected memory cell is initially at a logic high state, as apparent from the initial portion of the read phase. During the read phase, the word line WL_0 is driven high, thereby turning on access transistor 130. The local bit line LBL_N0 will be driven to the level stored in capacitor 130C. Local bit line LBL_N0 being at a logic high level will turn on block read transistor 118 corresponding to the selected memory cell. Block read transistor 118 will attempt to pull complement bank bit line KBLC_N low. In this case, with control signal CSEL high and IO_T low, the true bank bit line KBLT_N is driven to ground which activates transistor 212 in latch circuit 254 to pull the complement bank bit line KBLC_N high against the block read transistor 118. Contention between transistor 212 and the block read transistor 118 will therefore exist. In order to control such a contention condition, transistor 212 is preferably made stronger than block read transistor 118 so as to allow the complement bank bit line KBLC_N to be driven to a weak logic high level against the pull-down action of the block read transistor.

In order to write a logic low into the selected memory cell, true bank bit line KBLT_N is driven to a logic low level via true IO line IO_T, and complement bank bit line KBLC_N is driven to a logic high level via complement IO line IO_C. During a "Write" phase, write word line WWL_0 is driven high to thereby turn on block write transistor 110 corresponding to the selected memory cell. Turning on transistor 110 causes the local bit line LBL_N0 to be driven to the logic level of the corresponding true bank bit line, which is low in the illustrative case of FIG. 3D. Since word line WL_0 remains active during the Write phase, the capacitor 130C corresponding to the selected memory cell begins to discharge substantially to the voltage potential (logic low) of the local bit line LBL_N0 through access transistor 130. The local bit line being a logic low level will turn off block read transistor 118, thereby essentially eliminating any contention problems. Once a sufficient amount of time has passed to allow the memory cell voltage (Cell_Voltage), measured across storage capacitor 130C, to substantially reach the potential of the intended logic state, a logic low level (ground), the word line WL_0 is driven low, thereby turning off access transistor 130 and isolating the storage capacitor 130C from the bank bit lines. Write word line WWL_0 and control signal CSEL are then driven low, thus completing the Write phase.

When a logic high is to be written into a selected memory cell in which a logic high is initially stored, or when a logic low is to be written into a selected memory cell in which a logic low is initially stored, these cases are similar to the write-back operation previously described in conjunction with FIGS. 3A and 3B.

Figure 4:
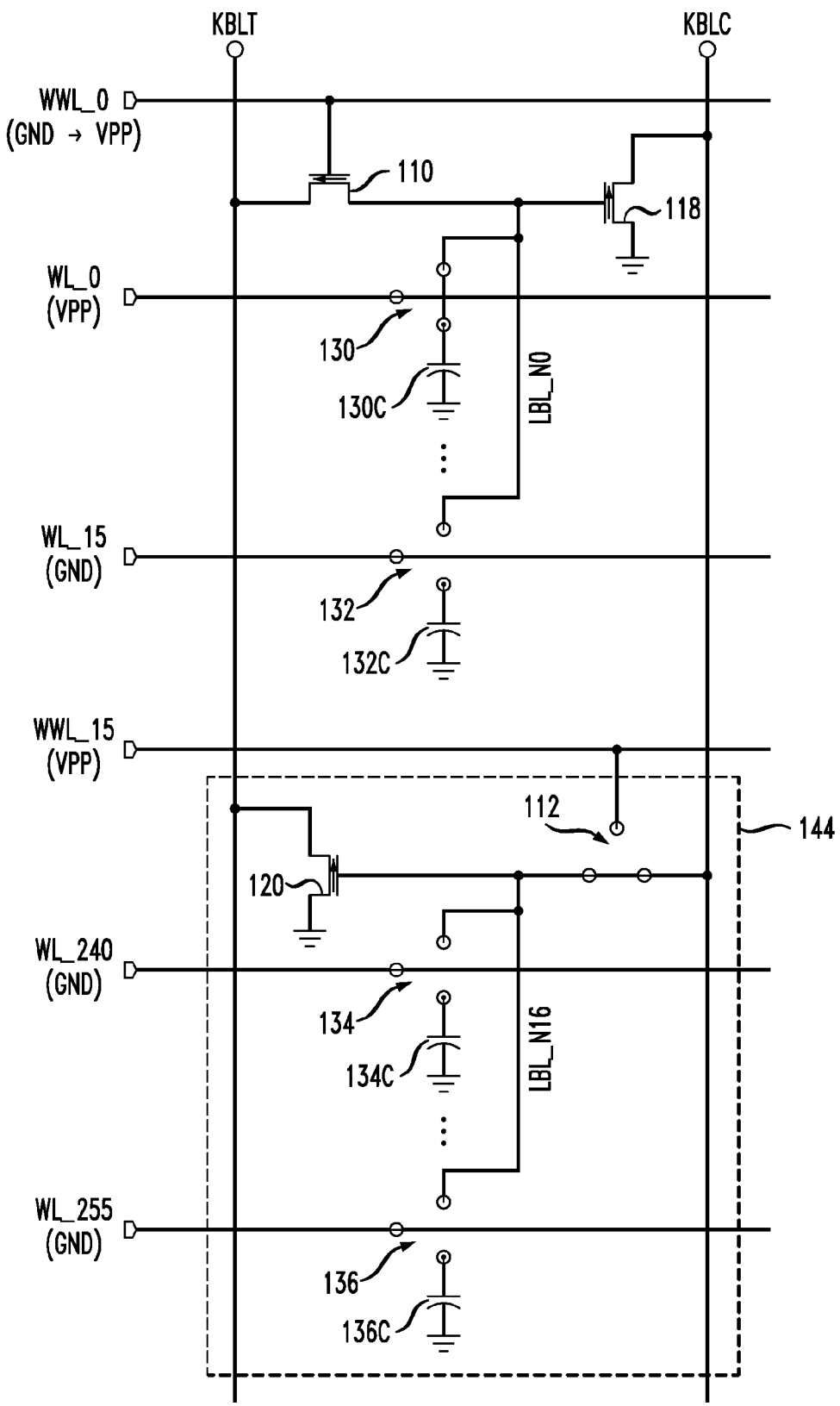
FIG. 4 is a schematic diagram illustrating at least a portion of a replication circuit, as employed in the exemplary sense amplifier circuit of FIG. 2, implemented using a portion of the exemplary memory circuit shown in FIG. 1, in accordance with another aspect of the present invention.

FIG. 4 is a schematic diagram illustrating at least a portion of the memory circuit 100 shown in FIG. 1. As apparent from FIG. 4, rather than using a pair of switch circuits 450a and 450b, including NMOS transistor devices 214, 216, 218, 220, the replication circuit 256 in the sense amplifier depicted in FIG. 2 can be implemented using two or more inactive block circuits in the exemplary memory circuit 100 shown in FIG. 1, in accordance with another aspect of the present invention. At least one inactive block circuit is need for providing a replication path from the complement bank bit line (e.g., KBLC_N) to the true bank bit line (KBLT_N), as shown, and at least one other inactive block circuit is required for providing a replication path from the true bank bit line to the complement bank bit line (e.g., block circuit 140 could be used if memory cell 134/134C is selected).

With reference to FIG. 4, only one of the two or more inactive block circuits needed to implement the replication circuit 256 (see FIG. 2) is shown, namely, block circuit 144. For the exemplary case in which memory cell 130/130C is the selected memory cell, only the replication path from the complement bank bit line KBLC_N to the true bank bit line KBLT_N need be discussed since KBLC_N is the active bank bit line in this case. An understanding of how the replication path from a true bank bit line to a corresponding complement bank bit line can be easily derived by interchanging transistor connections to true and complement bank bit lines KBLC and KBLT in the sense amplifier circuit 200 (FIG. 2) and by changing the word line numbering so as to address other active banks having block read transistors connected to the true bank bit line, as will become apparent to those skilled in the art.

To read from selected memory cell 130/130C, word line WL_0 is driven to a logic high level, VPP. Here, the voltage VPP is a voltage which is greater than the positive supply voltage VDD (e.g., about a transistor threshold above VDD). WL_0 being high will turn on access transistor 130 in the selected memory cell, thereby placing the voltage stored in capacitor 130C on the local bit line LBL_N0, as previously explained. The replication function of switch circuit 450a in the sense amplifier circuit 200 of FIG. 2 can be performed by inactive block circuit 144 in the following manner. In FIG. 4, transistors are depicted conceptually (e.g., as short or open circuits), configured so as to implement the replication functionality of switch circuit 450a (FIG. 2). Specifically, in block circuit 144, all memory cells are unselected by driving corresponding word lines WL_240 and WL_255 to a logic low level (e.g., GND). Thus, local bit line LBL_N16 will be effectively isolated from the memory cells. Write word line WWL_15 is driven high (e.g., VPP) by a signal serving as the strobe signal ENT, thereby turning on block write transistor 112. With transistor 112 turned on, complement bank bit line KBLC will be connected to the gate of block read transistor 120, thus enabling the signal on the complement bank bit line KBLC to control transistor 120. When the state on complement bank bit line KBLC is at least a weak "1," transistor 120 will turn on and discharge true bank bit line KBLT to a logic low level (e.g., GND). Alternatively, when the state on complement bank bit line KBLC is a weak "0," transistor 120 will be turned off and true bank bit line KBLT will remain precharged high. Thus, with write word line WWL_15 serving as the strobe signal ENT, block read transistor 120 provides the equivalent function of transistor 220 in the sense amplifier circuit 200 shown in FIG. 2.

The techniques of the present invention described herein, specifically, exemplary sense amplifier 200 depicted in FIG. 2, can also be used, with or without modification, to detect the logic states of individual memory cells known as gain cells. Gain cells are well known by those skilled in the art. The conductance of these gains cells varies as a function of their stored logic states.

At least a portion of the sense amplifier circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A sense amplifier circuit for sensing a logic state of a selected memory cell in a memory circuit, the sense amplifier circuit comprising:

a precharge circuit adapted for connection to a complementary pair of bit lines corresponding to the selected memory cell, the precharge circuit being operative to selectively drive the complementary pair of bit lines to a first voltage in response to a first control signal;

a latch circuit adapted for connection to the complementary pair of bit lines; and a replication circuit adapted for connection to the complementary pair of bit lines, the replication circuit being operative to selectively transfer a voltage representative of a logic state on a first bit line of the complementary pair of bit lines to a second bit line of the complementary pair of bit lines in response to at least a second control signal.

2. The sense amplifier circuit of claim 1, further comprising a read and write port for selectively accessing the sense amplifier circuit in response to at least a third control signal.

3. The sense amplifier circuit of claim 1, further comprising a read and write port operative to selectively connect the complementary pair of bit lines to a corresponding complementary pair of input/output lines in response to at least a third control signal.

4. The sense amplifier circuit of claim 3, wherein the read and write port comprises:
a first transistor including a first source/drain adapted for connection to a first input/output line of the complementary pair of input/output lines, a second source/drain adapted for connection to the first bit line and a gate adapted for receiving the third control signal; and
a second transistor including a first source/drain adapted for connection to a second input/output line of the complementary pair of input/output lines, a second source/drain adapted for connection to the second bit line and a gate adapted for receiving the third control signal.

5. The sense amplifier circuit of claim 1, wherein the precharge circuit comprises:
a first transistor including a first source/drain adapted for connection to a first voltage source supplying the first voltage, a second source/drain adapted for connection to the first bit line and a gate adapted for receiving the first control signal; and
a second transistor including a first source/drain adapted for connection to the first voltage source supplying the first voltage, a second source/drain adapted for connection to the second bit line and a gate adapted for receiving the first control signal.

6. The sense amplifier circuit of claim 1, wherein the first voltage is substantially equal to at least a positive supply voltage of the sense amplifier circuit.

7. The sense amplifier circuit of claim 1, wherein the latch circuit comprises:
a first transistor including a first source/drain adapted for connection to a first voltage source supplying the first voltage, a second source/drain adapted for connection to the first bit line and a gate adapted for connection to the second bit line; and
a second transistor including a first source/drain adapted for connection to the first voltage source supplying the first voltage, a second source/drain adapted for connection to the second bit line and a gate adapted for connection to the first bit line.

8. The sense amplifier circuit of claim 1, wherein the replication circuit comprises:
at least a first switch circuit adapted for connection between the first bit line and a second voltage source supplying a second voltage, the first switch circuit including a first input adapted for receiving the second control signal and a second input adapted for connection to the second bit line.

9. The sense amplifier circuit of claim 8, wherein the first switch circuit comprises first and second transistors, a first source/drain of the first transistor being adapted for connection to the first bit line, a second source/drain of the first transistor being adapted for connection to a first source/drain of the second transistor, a gate of the first transistor being adapted for receiving the second control signal, a second source/drain of the second transistor being adapted for connection to the second voltage source, and a gate of the second transistor being adapted for connection to the second bit line.

10. The sense amplifier circuit of claim 1, wherein at least a portion of the latch circuit is integrated with the replication circuit.

11. The sense amplifier circuit of claim 1, wherein the sense amplifier circuit is configured such that activation of the replication circuit is delayed relative to activation of the selected memory cell.

12. The sense amplifier circuit of claim 11, wherein the delay in activation of the replication circuit relative to the selected memory cell is selected so as to permit the development of at least a weak logic low state on one of the first and second bit lines.

13. An integrated circuit including at least one sense amplifier circuit for sensing a logic state of a selected memory cell in a memory circuit, the at least one sense amplifier circuit comprising:
a precharge circuit adapted for connection to a complementary pair of bit lines corresponding to the selected memory cell, the precharge circuit being operative to selectively drive the complementary pair of bit lines to a first voltage in response to a first control signal;
a latch circuit adapted for connection to the complementary pair of bit lines; and
a replication circuit adapted for connection to the complementary pair of bit lines, the replication circuit being operative to selectively transfer a voltage representative of a logic state on a first bit line of the complementary pair of bit lines to a second bit line of the complementary pair of bit lines in response to at least a second control signal.

14. The integrated circuit of claim 13, wherein the precharge circuit comprises:
a first transistor including a first source/drain adapted for connection to a first voltage source supplying the first voltage, a second source/drain adapted for connection to the first bit line and a gate adapted for receiving the first control signal; and
a second transistor including a first source/drain adapted for connection to the first voltage source supplying the first voltage, a second source/drain adapted for connection to the second bit line and a gate adapted for receiving the first control signal.

15. The integrated circuit of claim 13, wherein the first voltage is substantially equal to at least a positive supply voltage of the sense amplifier circuit.

16. The integrated circuit of claim 13, wherein the latch circuit comprises:
a first transistor including a first source/drain adapted for connection to a first voltage source supplying the first voltage, a second source/drain adapted for connection to the first bit line and a gate adapted for connection to the second bit line; and
a second transistor including a first source/drain adapted for connection to the first voltage source supplying the first voltage, a second source/drain adapted for connection to the second bit line and a gate adapted for connection to the first bit line.

17. The integrated circuit of claim 13, wherein the replication circuit comprises:
at least a first switch circuit adapted for connection between the first bit line and a second voltage source supplying a second voltage, the first switch circuit including a first input adapted for receiving the second control signal and a second input adapted for connection to the second bit line.

18. The integrated circuit of claim 17, wherein the first switch circuit comprises first and second transistors, a first source/drain of the first transistor being adapted for connection to the first bit line, a second source/drain of the first transistor being adapted for connection to a first source/drain of the second transistor, a gate of the first transistor being adapted for receiving the second control signal, a second source/drain of the second transistor being adapted for connection to the second voltage source, and a gate of the second transistor being adapted for connection to the second bit line.

19. The integrated circuit of claim 13, wherein the sense amplifier circuit is configured such that activation of the replication circuit is delayed relative to activation of the selected memory cell.

20. The integrated circuit of claim 19, wherein the delay in activation of the replication circuit relative to the selected memory cell is selected so as to permit the development of at least a weak logic low state on one of the first and second bit lines.

* * * * *